(12) United States Patent
Tanaka

(10) Patent No.: US 8,462,429 B2
(45) Date of Patent: Jun. 11, 2013

(54) OPTICAL COMBINER AND FIBER LASER DEVICE HAVING THE SAME

(75) Inventor: Hironori Tanaka, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/455,667

(22) Filed: Apr. 25, 2012

(65) Prior Publication Data

US 2012/0206793 A1 Aug. 16, 2012

Related U.S. Application Data

(63) Continuation of application No. PCT/JP2010/067913, filed on Oct. 13, 2010.

(30) Foreign Application Priority Data

Oct. 27, 2009 (JP) .................................. 2009-246863

(51) Int. Cl.
*H01S 3/00* (2006.01)

(52) U.S. Cl.
USPC ........................................ 359/341.3; 385/31

(58) Field of Classification Search
USPC ................. 385/31, 38, 50; 359/341.3, 341.33
See application file for complete search history.

(56) References Cited

U.S. PATENT DOCUMENTS

| 7,492,993 B2 * | 2/2009 | Nakai et al. .................... 385/46 |
| 7,720,340 B2 * | 5/2010 | Lewis et al. .................... 385/127 |
| 7,822,080 B2 * | 10/2010 | Jiang .................................. 372/6 |
| 2007/0280597 A1 | 12/2007 | Nakai et al. |
| 2009/0148098 A1 * | 6/2009 | Lewis et al. ...................... 385/31 |
| 2009/0154879 A1 * | 6/2009 | Salokatve ....................... 385/43 |
| 2010/0118897 A1 | 5/2010 | Tanigawa et al. |
| 2010/0142894 A1 * | 6/2010 | Gonthier ......................... 385/50 |

FOREIGN PATENT DOCUMENTS

| EP | 2 071 375 A1 | 6/2009 |
| JP | 2007-506119 A | 3/2007 |
| JP | 2007-163650 A | 6/2007 |
| JP | 2008-010804 A | 1/2008 |
| JP | 2008-064875 A | 3/2008 |
| JP | 2008-277582 A | 11/2008 |
| WO | 2005/029146 A1 | 3/2005 |

OTHER PUBLICATIONS

International Search Report of PCT/JP2010/067913, mailing date Nov. 9, 2010.

\* cited by examiner

*Primary Examiner* — Mark Hellner
(74) *Attorney, Agent, or Firm* — Westerman, Hattori, Daniels & Adrian, LLP

(57) ABSTRACT

An optical combiner 100 includes: fibers for propagation of pumping light 20 configured to propagate pumping light; a fiber for propagation of laser light 10 configured to propagate laser light having a longer wavelength than the pumping light; and a large area fiber 30 having a core 31 and a clad 32 and configured to propagate laser light and pumping light, in which one end surface of the fiber for propagation of laser light 10 and one end surface of the large area fiber 30 are fused, one end surfaces of the fibers for propagation of pumping light 20 and the one end surface of the large area fiber 30 are fused, and the fiber for propagation of laser light 10 and the fibers for propagation of pumping light 20 are not fused to each other.

9 Claims, 5 Drawing Sheets

OPTICAL COMBINER AND FIBER LASER DEVICE HAVING THE SAME

TECHNICAL FIELD

The invention relates to an optical combiner and a fiber laser device having the optical combiner.

BACKGROUND ART

In a fiber laser device, pumping light is input to an amplifying optical fiber with a core doped with rare-earth elements and coated with a clad, and laser light such as signal light is amplified by the pumping light. Further, the amplified laser light is output from a core at one end of the amplifying optical fiber.

Such a fiber laser device has an optical combiner in some cases to input pumping light to the amplifying optical fiber. Patent Document 1 mentioned below discloses an example of the optical combiner.

In the optical combiner disclosed in Patent Document 1 below, a fiber for propagation of laser light which allows propagation of laser light such as signal light, and fibers for propagation of pumping light which allow propagation of pumping light are fused to a double clad fiber having a core and a clad. More specifically, an end of the fiber for propagation of laser light which allows propagation of laser light such as signal light and the end of the fibers for propagation of pumping light which allow propagation of pumping light are bundled, and the side surface of the fiber for propagation of laser light and the side surface of the fibers for propagation of pumping light are fused to each other. Further, the positions of the core of the fiber for propagation of laser light and the core of the double clad fiber having the core and the clad are aligned, and the end surface of the fiber for propagation of laser light and the end surface of the fibers for propagation of pumping light are fused to the end surface of the double clad fiber. Thus, laser light propagates between the core of the double clad fiber and the core of the fiber for propagation of laser light, and pumping light propagates between clads of the fibers for propagation of pumping light and the double clad fiber (Patent Document 1).

CITATION LIST

Patent Document

[Patent Document 1] Japanese Translation of PCT Application Laid-Open No. 2007-506119

SUMMARY OF THE INVENTION

Objects to be Achieved by the Invention

Note that examples of the fiber laser device includes a fiber laser device having a so-called backward-pumped configuration which outputs laser light from an end to which pumping light of the amplifying optical fiber is input. When the optical combiner disclosed in Patent Document 1 is used for such a fiber laser device, the fibers for propagation of pumping light are connected to a pumping light source and the double clad fiber is connected to the amplifying optical fiber to output laser light which is amplified in the amplifying optical fiber through the double clad fiber and the fiber for propagation of laser light of the optical combiner. However, in this fiber laser device, the pumping laser light source is damaged.

It is therefore an object of the invention to provide an optical combiner capable of realizing a fiber laser device which prevents a pumping light source from being damaged, and a fiber laser device having the optical combiner.

Means for Achieving the Objects

To attain the object, the inventors have devoted themselves to investigate the cause of damage on the pumping light source in the fiber laser device having the optical combiner disclosed in Patent Document 1. As a result, it was found that, with the optical combiner disclosed in Patent Document 1, when laser light propagates from the double clad fiber to the fiber for propagation of laser light, there are cases where part of laser light is input to the fiber for propagation of pumping light. Further, it was found that there are cases where laser light input to the fiber for propagation of pumping light damages the pumping light source.

Hence, the inventors further devoted themselves to investigate the cause for part of laser light being input to the fiber for propagation of pumping light. As a result, the following conclusion has been reached. With an optical combiner in which the end surface of the double clad fiber and the end surface of the fiber for propagation of laser light are fused like the optical combiner disclosed in Patent Document 1, when laser light propagates between the double clad fiber and the fiber for propagation of laser light, there are cases where laser light is scattered or reflected at the fused portion of the double clad fiber and the fiber for propagation of laser light. In this case, the scattered or reflected laser light leaks from the core of the fiber for propagation of laser light. Further, it was concluded that the leaked laser light is input from the fiber for propagation of laser light to the fiber for propagation of pumping light at the fused portion at which the side surface of the fiber for propagation of laser light and the side surface of the fiber for propagation of pumping light are fused to each other.

Furthermore, the inventors made further investigation to achieve the invention.

Specifically, an optical combiner according to the invention includes: a fiber for propagation of pumping light having a core and a clad and configured to propagate pumping light from a pumping light source; a fiber for propagation of laser light having a core and a clad and configured to propagate laser light having a longer wavelength than the pumping light; and a large area fiber having a core and a clad and configured to propagate the laser light and the pumping light, in which one end surface of the fiber for propagation of laser light and one end surface of the large area fiber are fused such that the core of the fiber for propagation of laser light and the core of the large area fiber overlap in a longitudinal direction of the large area fiber, one end surface of the fiber for propagation of pumping light and the one end surface of the large area fiber are fused such that the core of the fiber for propagation of pumping light and the clad of the large area fiber overlap in the longitudinal direction of the large area fiber, and the fiber for propagation of laser light and the fiber for propagation of pumping light are not fused to each other.

According to such an optical combiner, since the one end surface of the fiber for propagation of pumping light and the one end surface of the large area fiber are fused such that the core of the fiber for propagation of pumping light and the clad of the large area fiber overlap in the longitudinal direction of the large area fiber, pumping light is input from the fiber for propagation of pumping light to the clad of the large area fiber. Furthermore, since the one end surface of the fiber for propagation of laser light and the one end surface of the large area fiber are fused such that the core of the fiber for propagation of laser light and the core of the large area fiber overlap in the longitudinal direction of the large area fiber, laser light propagates between the large area fiber and the fiber for propagation of laser light. In this case, even when laser light is scattered or reflected at a portion at which the large area fiber and the fiber for propagation of laser light are fused and leaks from the core of the fiber for propagation of laser light, it is possible to prevent the leaked laser light from being input to the fiber for propagation of pumping light since the fiber for propagation of pumping light and the fiber for propagation of laser light are not fused. Consequently, it is possible to realize the fiber laser device which prevents the pumping light source from being damaged by using such an optical combiner.

Further, preferably, in the optical combiner, the fiber for propagation of laser light and the fiber for propagation of pumping light are spaced apart at the one end surface of the large area fiber.

According to such a configuration, it is possible to prevent leaked laser light from being input to the fiber for propagation of pumping light.

Further, preferably, in above the optical combiner, a plurality of fibers for propagation of pumping light is provided.

With such a configuration, it is possible to input more pumping light to the large area fiber.

Further, preferably, in the optical combiner, an outer diameter of the clad of the fiber for propagation of laser light is equal to or smaller than a diameter of the core of the fiber for propagation of pumping light.

With such a configuration, when seven fibers (one fiber for propagation of laser light and six fibers for propagation of pumping light) are arranged in a closely-packed manner, a space is formed between one fiber for propagation of laser light arranged in the center and six fibers for propagation of pumping light arranged therearound, so that it is possible to prevent leaked laser light from being input to the fiber for propagation of pumping light.

Further, a fiber laser device according to the invention includes: a pumping light source configured to output pumping light; the optical combiner; an amplifying optical fiber having a core doped with a rare-earth element to be pumped by the pumping light, and a clad, in which a first FBG configured to reflect light in part of a wavelength band of spontaneous emission light emitted by the rare-earth element is formed at one end of the amplifying optical fiber, and a second FBG configured to reflect light of a wavelength equal to that of light reflected by the first FBG at a reflectance lower than that of the first FBG is formed at the other end of the amplifying optical fiber, and in the optical combiner, the fiber for propagation of pumping light is connected with the pumping light source, and the large area fiber is connected with the other end of the amplifying optical fiber.

With such a fiber laser device, pumping light is input to the other end of the amplifying optical fiber through the optical combiner, and the rare-earth element doped in the core of the amplifying optical fiber are pumped to emit spontaneous emission light. The spontaneous emission light travels back and forth between the first FBG and second FBG and is amplified as laser light. Further, part of laser light is transmitted through the second FBG, and output from the other end of the amplifying optical fiber. The laser light output from the amplifying optical fiber propagates through the core of the large area fiber in the optical combiner, is input to the fiber for propagation of laser light and is output from the fiber for propagation of laser light. In this case, even when laser light is scattered at the portion at which the large area fiber and fiber for propagation of laser light are fused and leaks from the core of the fiber for propagation of laser light, the leaked laser light is prevented from being input to the fiber for propagation of pumping light since the fiber for propagation of pumping light and the fiber for propagation of laser light are not fused. Consequently, it is possible to prevent the pumping light source connected with the fiber for propagation of pumping light from being damaged.

Further, preferably, the fiber laser device further includes: a second pumping light source configured to output pumping light; and the optical combiner as a second optical combiner, in which in the second optical combiner, the fiber for propagation of pumping light is connected with the second pumping light source, and the large area fiber is connected with the one end of the amplifying optical fiber.

According to such a configuration, pumping light is input to one end and the other end of the amplifying optical fiber, so that it is possible to output a more intense laser light. On the other hand, when laser light travels back and forth between the first FBG and second FBG, there are cases where part of laser light is transmitted through the first FBG. In this case, laser light transmitted through the first FBG propagates through the core of the large area fiber in the second optical combiner, and is input to the fiber for propagation of laser light. In this case, even when laser light is scattered at the portion at which the large area fiber and fiber for propagation of laser light are fused and leaks from the core of the fiber for propagation of laser light, the leaked laser light is prevented from being input to the fiber for propagation of pumping light in the second optical combiner. Consequently, it is possible to prevent the second pumping light source connected with the fiber for propagation of pumping light in the second optical combiner from being damaged.

Further, a fiber laser device according to the invention includes: a pumping light source configured to output pumping light; the optical combiner; and an amplifying optical fiber having a core doped with a rare-earth element to be pumped by the pumping light and a clad, and configured to receive an input of seed laser light of a longer wavelength than the pumping light to be amplified by stimulated emission from the rare-earth element to one end thereof, in which, in the optical combiner, the fiber for propagation of pumping light is connected with the pumping light source, and the large area fiber is connected with the other end of the amplifying optical fiber.

With such a fiber laser device, pumping light is input to the other end of the amplifying optical fiber through the optical combiner, and the rare-earth elements doped in the core of the amplifying optical fiber are pumped. Further, seed laser light is input to one end of the amplifying optical fiber, and seed laser light is amplified by stimulated emission from rare-earth elements by the seed laser light. The amplified seed laser light is input from the other end of the amplifying optical fiber to the large area fiber of the optical combiner as laser light, propagates through the core of the large area fiber, is input to the fiber for propagation of laser light and is output from the fiber for propagation of laser light. Consequently, it is possible to reduce core propagation loss in the optical amplifying circuit and increase the energy conversion efficiency from pumping light into laser light. Further, there are cases where laser light is scattered at the portion at which the large area fiber and the fiber for propagation of laser light are fused when laser light propagates from the laser area fiber to the fiber for propagation of laser light, and laser light leaks from the core of the fiber for propagation of laser light. However, even in such case, the leaked laser light is prevented from being input to the fiber for propagation of pumping light.

Consequently, it is possible to prevent the pumping light source connected with the fiber for propagation of pumping light from being damaged.

Further, preferably, the fiber laser device further includes: a second pumping light source configured to output pumping light; and the optical combiner as a second optical combiner, in which in the second optical combiner, the fiber for propagation of pumping light is connected with the second pumping light source, and the large area fiber is connected with the one end of the amplifying optical fiber, and the seed laser light is input to the amplifying optical fiber through the second optical combiner.

According to such a configuration, pumping light from the second pumping light source is input through the second optical combiner, and seed laser light is input to the amplifying optical fiber through the fiber for propagation of laser light of the second optical combiner. Further, pumping light is input to one end and the other end of the amplifying optical fiber, so that it is possible to output a more intense laser light. At this time, there are cases where part of laser light amplified at the output end is reflected. In this case, the reflected laser light propagates from the amplifying optical fiber to the second optical combiner. In this case, the reflected laser light is prevented from being input to the fiber for propagation of pumping light at the portion of the second optical combiner at which the large area fiber and the fiber for propagation of laser light are fused. Further, when the seed laser light propagates from the fiber for propagation of laser light to the large area fiber in the second optical combiner, even if the seed laser light is reflected and leaks from the core of the fiber for propagation of laser light, the leaked seed laser light is prevented from being input to the fiber for propagation of pumping light in the second optical combiner. Consequently, it is possible to prevent the second pumping light source connected with the fiber for propagation of pumping light of the second optical combiner from being damaged.

Further, a fiber laser device according to the invention includes: a pumping light source configured to output pumping light; the optical combiner; and an amplifying optical fiber having a core doped with a rare-earth element to be pumped by the pumping light, and a clad, in which a first FBG configured to reflect light in part of a wavelength band of spontaneous emission light emitted by the rare-earth element is formed at one end of the amplifying optical fiber, and a second FBG configured to reflect light of a wavelength equal to that of light reflected by the first FBG at a reflectance lower than that of the first FBG is formed at the other end of the amplifying optical fiber, and in the optical combiner, the fiber for propagation of pumping light is connected with the pumping light source, and the large area fiber is connected with the one end of the amplifying optical fiber.

According to such a fiber laser device, it is possible to reduce core propagation loss at the emission end and increase the energy conversion efficiency from pumping light into laser light. Further, when laser light resonates between the first FBG and second FBG, there are cases where part of laser is transmitted through the first FBG. The laser light transmitted through the first FBG propagates through the core of the large area fiber in the optical combiner, and is input to the fiber for propagation of laser light. In this case, even when laser light is scattered at the portion at which the large area fiber and fiber for propagation of laser light are fused and leaks from the core of the fiber for propagation of laser light, the leaked laser light is prevented from being input to the fiber for propagation of pumping light. Consequently, it is possible to prevent the pumping light source connected with the fiber for propagation of pumping light from being damaged.

Further, a fiber laser device according to the invention includes: a pumping light source configured to output pumping light; the optical combiner; and an amplifying optical fiber having a core doped with a rare-earth element to be pumped by the pumping light and a clad, and configured to receive an input of seed laser light of a longer wavelength than the pumping light amplified by stimulated emission from the rare-earth element to one end thereof, in which in the optical combiner, the fiber for propagation of pumping light is connected with the pumping light source, and the large area fiber is connected with the one end of the amplifying optical fiber, and the seed laser light is input to the amplifying optical fiber through the optical combiner.

According to such a fiber laser device, seed laser light is input from the fiber for propagation of laser light of the optical combiner to the amplifying optical fiber through the large area fiber, and pumping light is input from the fiber for propagation of pumping light of the optical combiner to the amplifying optical fiber through the large area fiber. Then, in the amplifying optical fiber, the seed laser light is amplified and output. At this time, there are cases where part of laser light is reflected at the output end. In this case, the reflected laser light propagates from the amplifying optical fiber to the fiber for propagation of laser light through the large area fiber. At this time, the reflected laser light is prevented from being input to the fiber for propagation of pumping light at the portion at which the large area fiber and the fiber for propagation of laser light are fused. Further, when the seed laser light propagates from the fiber for propagation of laser light to the large area fiber at the portion at which the large area fiber and the fiber for propagation of laser light area fused, even if the seed laser light is reflected and leaks from the core of the fiber for propagation of laser light, the leaked seed laser light is prevented from being input to the multi mode fiber. Consequently, it is possible to prevent the pumping light source connected with the multi mode fiber from being damaged.

Further, preferably, in the fiber laser device, the core of the large are fiber of the optical combiner is doped with the rare-earth element to be pumped by the pumping light, the amplifying optical fiber and the large area fiber are configured in a same manner, and the amplifying optical fiber and the large area fiber is preferably formed of a portion which is an extension of the amplifying optical fiber.

According to such a configuration, laser light is also amplified in the large area fiber, and there is no connection portion between the large area fiber and amplifying optical fiber, so that it is possible to prevent loss of laser light due to scattering of laser light at the connection portion and output more intense laser light. Further, by configuring the large area fiber and the amplifying optical fiber in the same manner, it is possible to produce the fiber laser device at a low cost.

Effects of the Invention

According to the invention, an optical combiner capable of realizing a fiber laser device which prevents a pumping light source from being damaged, and a fiber laser device having the optical combiner are provided.

EMBODIMENTS OF THE INVENTION

Figure 1:
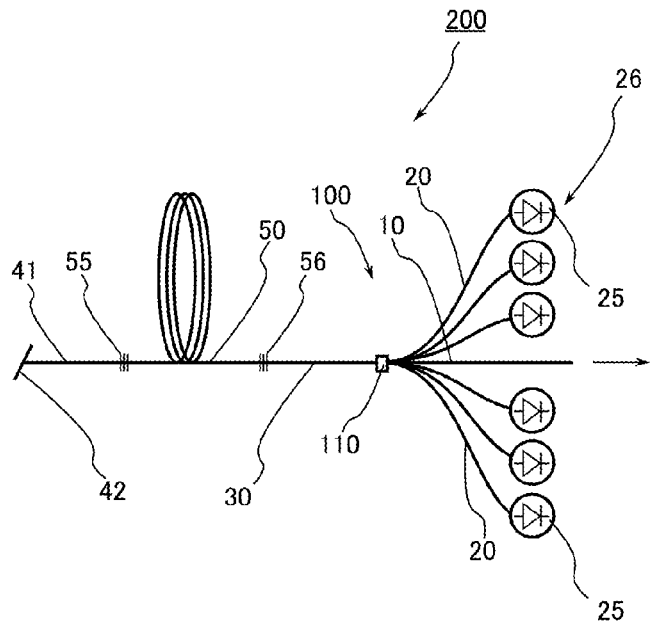
FIG. 1 shows a fiber laser device according to a first embodiment of the invention.

Hereinafter, suitable embodiments of a fiber laser device according to the invention will be described in detail referring to the drawings.

First Embodiment

FIG. 1 shows a fiber laser device according to a first embodiment of the invention.

As shown in FIG. 1, a fiber laser device 200 is a fabry-perot fiber laser device. The fiber laser device 200 mainly includes a pumping light source 26, an optical combiner 100 connected with the pumping light source 26 and an amplifying optical fiber 50 connected with the optical combiner 100.

The pumping light source 26 includes a plurality of diode lasers (LD) 25 for outputting pumping light, and each LD 25 outputs pumping light of, for example, 915 nm.

Figure 2:
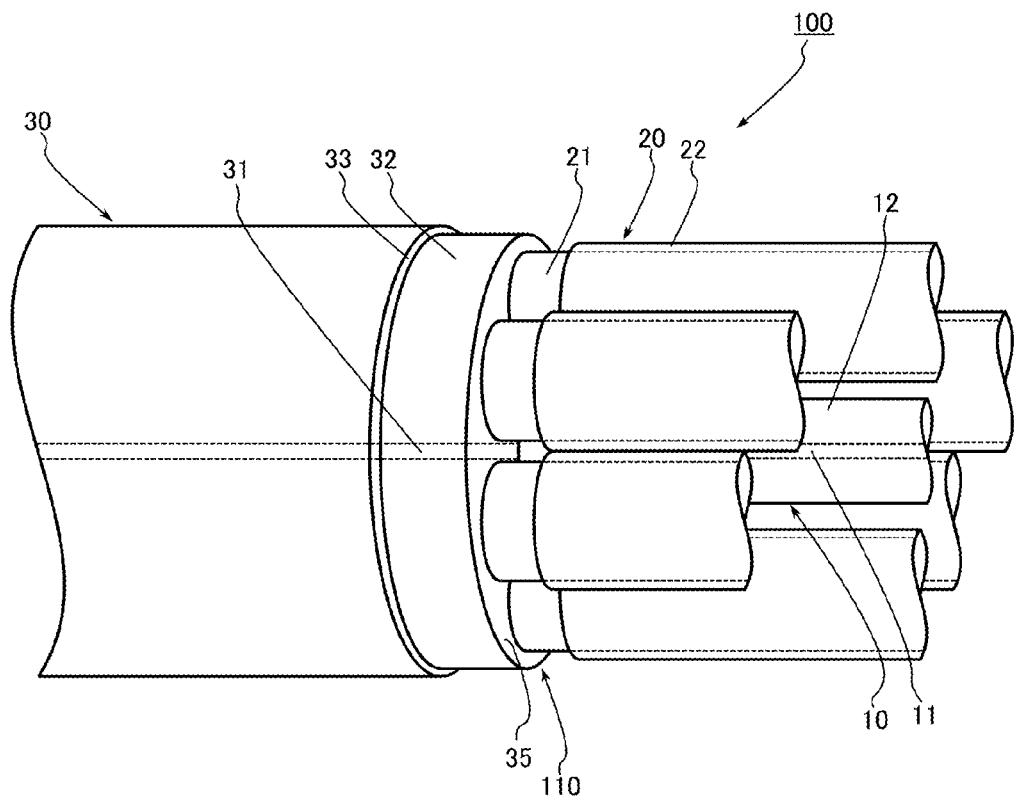
FIG. 2 is a perspective view showing an optical combiner shown in FIG. 1.

FIG. 2 is a perspective view showing the optical combiner 100 shown in FIG. 1. As shown in FIG. 2, the optical combiner 100 has a double clad fiber 30 which is a large area fiber, a plurality of multi mode fibers 20 which are fibers for propagation of pumping light fused at one end surface 35 of the double clad fiber 30, and a single mode fiber 10 which is a fiber for propagation of laser light fused at the one end surface 35 of the double clad fiber 30 together with the multi mode fibers 20. Thus, the multi mode fibers 20 and the single mode fiber 10 are fused at the one end surface 35 of the double clad fiber 30 to form a fused portion 110.

Figure 3:
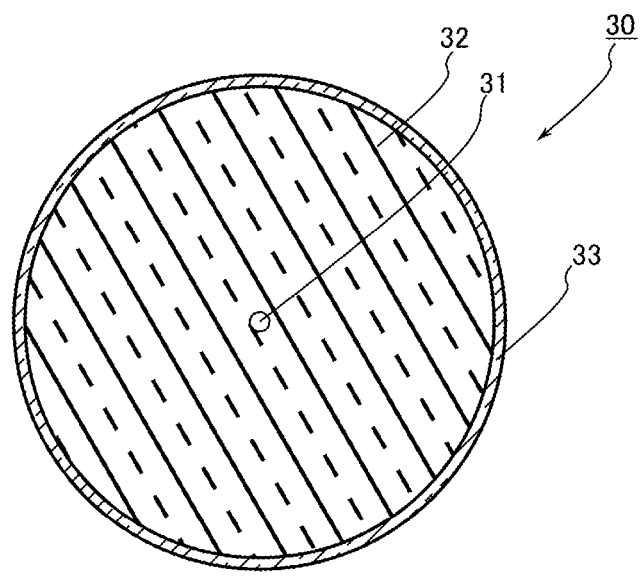
FIG. 3 is a sectional view showing a structure of a cross-section of a double clad fiber shown in FIG. 2.

FIG. 3 is a sectional view showing a structure of a cross-section of the double clad fiber 30 shown in FIG. 2. As shown in FIG. 3, the double clad fiber 30 has a core 31, a clad 32 coating the core 31, and a plastic clad 33 coating the clad 32. The clad 32 has a smaller refractive index than the core 31, and the plastic clad 33 has a significantly smaller refractive index than the clad 32. In addition, the core 31 may have, for example, a diameter of 10 μm, the clad may have, for example, an outer diameter of 450 μm and the plastic clad 33 may have, for example, an outer diameter of 550 μm. Furthermore, silica doped with an element such as germanium which increases the refractive index of silica, for example, may be used as a material for the core 21, silica doped with an element such as fluorine which decreases the refractive index of silica, for example, may be used as a material for the clad 22, and UV curable resin, for example, may be used as a material for the plastic clad 33.

Figure 4:
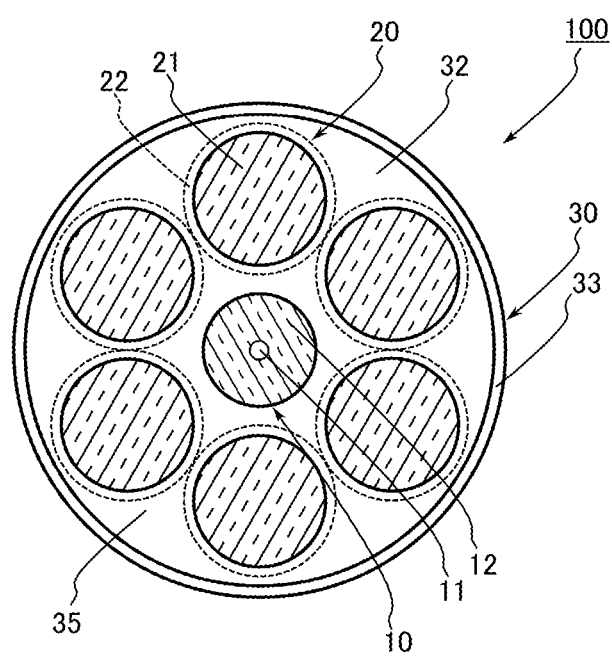
FIG. 4 is a sectional view showing a structure of a double clad fiber as seen from a cross-section at a fused portion of multi mode fibers and a single mode fiber of an optical combiner shown in FIG. 2.

FIG. 4 is a sectional view showing a structure of the double clad fiber 30 as seen from a cross-section at the fused portion 110 of the multi mode fibers 20 and the single mode fiber 10 of the optical combiner 100 shown in FIG. 2.

As shown in FIG. 4, each multi mode fiber 20 has a core 21 and a clad 22 coating the core 21. The clad 22 has a significantly lower refractive index than the core 21. In addition, when the clad 32 of the double clad fiber 30 has an outer diameter of 450 μm as described above, the core 21 of the multi mode fiber 20 has a diameter of 150 μm and the clad 22 has an outer diameter of 190 μm, for example. Furthermore, silica may be used as a material for the core 21 of the multi mode fiber 20, and silica doped with fluorine and having a lower refractive index than the core 21 or UV curable resin, for example, may be used as a material for the clad 22. Note that FIG. 2 shows a case where the clads 22 are made of resin.

The single mode fiber 10 has a core 11 and a clad 12 coating the core 11. The clad 12 has a lower refractive index than the core 11. In addition, the core 11 has a diameter equal to that of the core 31 of the double clad fiber 30, and the clad 12 has an outer diameter equal to or smaller than the diameter of the core 21 of the multi mode fiber 20 and is 125 μm, for example, when the core 21 of the multi mode fiber 20 has an outer diameter of 150 μm as described above. Furthermore, silica doped with germanium, for example, may be used as a material for the core 11 of the single mode fiber 10 and silica without any dopant may be used as a material for the clad 12.

As shown in FIGS. 2 and 4, in the double clad fiber 30, the plastic clad 33 is removed near the one end connected with the multi mode fibers 20 and single mode fiber 10. Further, in each multi mode fiber 20, the clad is removed near the one end connected with the double clad fiber 30. Furthermore, one end surfaces of the multi mode fibers 20 and the one end surface 35 of the double clad fiber 30 are fused such that the cores 21 of the multi mode fibers 20 and the clad 32 of the double clad fiber 30 overlap in the longitudinal direction of the double clad fiber 30. Note that, when the clad 22 of the multi mode fiber 20 is made of silica, the clad 22 of each multi mode fiber 21 need not be removed near the one end.

Further, one end surface of the single mode fiber 10 and the one end surface 35 of the double clad fiber 30 are fused such that the center axis of the core 11 of the single mode fiber 10 and the center axis of the core 31 of the double clad fiber 30 are aligned with each other, and the core 11 and core 31 overlap in the longitudinal direction of the double clad fiber 30.

In other words, the one end surface of the single mode fiber 10 and the one end surfaces of the multi mode fibers 20 are fused to the one end surface 35 the double clad fiber 30 such that the single mode fiber 10 is surrounded by a plurality of multi mode fibers 20 at the one end surface 35 of the double clad fiber 30.

In this case, the single mode fiber 10 and the multi mode fibers 20 are not fused and are respectively fused to the double clad fiber 30 in a state where the single mode fiber 10 and the multi mode fibers 20 are spaced apart. Note that, in FIGS. 2 and 4, six multi mode fibers 20 are closely packed and fused to surround the single mode fiber 10 and the single mode fiber 10 has a diameter equal to or smaller than that of the core 21 of the multi mode fiber 20, so that the single mode fiber 10 and the multi mode fibers 20 are sufficiently spaced apart.

The single mode fiber 10 and the multi mode fibers 20 and the double clad fiber 30 as described above are fused as follows. Note that a case where six multi mode fibers 20 are arranged around the single mode fiber 10 as shown in FIGS. 2 and 4 will be described below.

First, a case where the clads 22 of the multi mode fibers 20 are made of resin as described above will be described. When the clads 22 of the multi mode fibers 20 are made of resin, first, a portion of the clad 22 near one end of each multi mode fiber 20 is removed. Further, a pair of half tubes split along the longitudinal direction is provided, combined to form a tubular ferrule and fixed by means of a ring rubber such that the half tubes are not misaligned. Then, the six multi mode fibers 20 are bundled to be arranged around the single mode fiber 10, and the multi mode fibers 20 and the single mode fiber 10 are inserted in a through-hole of the ferrule. Furthermore, the end surface of the single mode fiber 10 and the end surfaces of the multi mode fibers 20 are adjusted to be coplanar such that the end surfaces of the multi mode fibers 20 and the single mode fiber 10 are in contact with a flat surface of a member having the flat surface, and the single mode fiber 10 and the multi mode fibers 20 are fixed by means of a clamp. Next, the single mode fiber 10 and the multi mode fibers 20 inserted in the through-hole of the ferrule are set in a fusing device, and the end surfaces of the single mode fiber 10 and the multi mode fibers 20 and the end surface 35 of the double clad fiber 30 are opposed at a predetermined interval. In this case, if the end surface of the single mode fiber 10 and the end surfaces of the multi mode fiber 20 are not aligned more or less, the end surface of the single mode fiber 10 and the end surfaces of the multi mode fibers 20 are pressed against the end surface 35 of the double clad fiber 30 one by one for adjustment, and are fixed again by means of a clamp. Next, only the end of the double clad fiber 30 is selectively preheated without preheating the single mode fiber 10 and to multi mode fibers 20 to slightly melt the end surface 35 of the double clad fiber 30. $CO_2$ laser is preferably used for a heat source from the viewpoint of selective preheating. Further, by pushing the single mode fiber 10 and the multi mode fibers 20 into the end surface of the double clad fiber 30, the end surface of the single mode fiber 10 and the end surface of the multi mode fibers 20 are made to contact the end surface 35 of the double clad fiber 30. Then, the vicinity of the end surfaces of the single mode fiber 10 and the multi mode fibers 20 and the vicinity of the end surface 35 of the double clad fiber 30 are further heated and then cooled to connect the end surfaces of the single mode fiber 10 and the multi mode fiber 20, and the end surface of the double clad fiber 30. Then, the ferrule is disassembled into the half tubes, and the half tubes are removed. By removing the ferrule in this manner, it is possible to prevent pumping light from leaking from the cores 21 of the multi mode fibers 20 to the ferrule.

Note that too large an inner diameter of the ferrule is not preferable because the diameter of the bundle of the single mode fiber 10 and the multi mode fibers 20 becomes too large, and too small an inner diameter of the ferrule is not preferable because the single mode fiber 10 or the multi mode fiber 20 is stuck upon insertion to the ferrule. Hence, when the outer diameter of the clad 12 of the single mode fiber 10 and the diameter of the cores 21 of the multi mode fibers 20 are both 105 μm, for example, the inner diameter of the ferrule is preferably about 320 μm.

Next, a case where the clads 22 of the multi mode fibers 20 are made of silica will be described. When the clad 22 of the multi mode fiber 20 is made of silica, the clad 22 is not removed near one end of each multi mode fiber 20 unlike the case where the clads 22 of the multi mode fibers 20 are made of resin. Further, a normal tubular ferrule is provided instead of using half tubes unlike the above. Then, similarly to the case where the clads 22 of the multi mode fibers 20 are made of resin, the multi mode fibers 20 and the single mode fiber 10 are inserted in the through-hole of the ferrule, the end surface of the single mode fiber 10 and the end surfaces of the multi mode fibers are adjusted to be coplanar, and the single mode fiber 10 and the multi mode fibers 20 are fixed by means of a clamp. Furthermore, similarly to the case where the clads 22 of the multi mode fibers 20 are made of resin, the single mode fiber 10 and the multi mode fibers 20 are set in the fusing device, and the end surfaces of the single mode fiber 10 and the multi mode fibers 20 are connected with the end surface 35 of the double clad fiber 30. Note that, when the clads 22 of the multi mode fibers are made of silica, the cores 21 of the multi mode fibers 20 are coated with the clads 22 up to the surfaces connected with the double clad fiber 30, whereby pumping light propagating through the cores 21 is prevented from leaking. Consequently, the ferrule need not be removed unlike the case where the clads 22 of the multi mode fibers 20 are made of resin.

Note that, similarly to the case where the clads 22 of the multi mode fibers 20 are made of resin, too large or too small an inner diameter of the ferrule is not preferable. Hence, when the outer diameter of the clad 12 of the single mode fiber 10 and the outer diameter of the clads 22 of the multi mode fibers 20 are both 125 μm, for example, the inner diameter of the ferrule is preferably about 377 μm to 380 μm.

Further, whether the clads 22 of the multi mode fibers 20 are made of resin or silica, the outer diameter of the clad 32 of the double clad fiber 30 is preferably equal to the inner diameter of the ferrule or about 1 to 5 μm larger than the inner diameter of the ferrule so as to prevent the end surfaces of the multi mode fibers 20 from being fused to the end surface of the double clad fiber 30 in a state sticking out therefrom.

Furthermore, the other end of each multi mode fiber 20 is connected with each LD 25 of the pumping light source 26 as shown in FIG. 1, and the other end of the single mode fiber 10 is a free end. Still further, the other end of the double clad fiber 30 is connected with the amplifying optical fiber 50.

Figure 5:
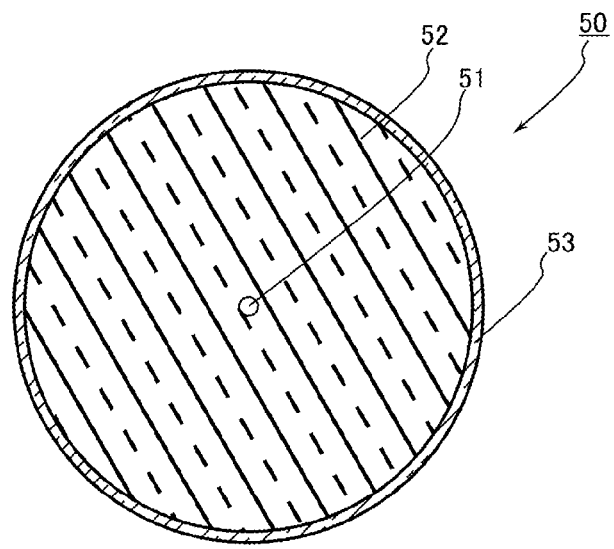
FIG. 5 is a sectional view showing a structure of a cross-section of an amplifying optical fiber shown in FIG. 1.

FIG. 5 is a sectional view showing a structure of a cross-section of the amplifying optical fiber 50 shown in FIG. 1. As shown in FIG. 5, the amplifying optical fiber 50 has a core 51, and a clad 52 coating the core 51 and a plastic clad 53 coating the clad 52. The clad 52 has a smaller refractive index than the core 51, and the plastic clad 53 has a significantly smaller refractive index than the clad 52. Further, the core 51 has a diameter equal to that of the core 31 of the double clad fiber 30, the clad 52 has an outer diameter equal to that of the clad 32 of the double clad fiber 30, and the plastic clad 53 has an outer diameter equal to that of the plastic clad 33 of the double clad fiber 30. Furthermore, silica doped with rare-earth elements such as erbium which is pumped by pumping light output from the pumping light source 26 and an element such as germanium which increases the refractive index of silica, for example, may be used as a material for the core 51, silica doped with an element such as fluorine which decreases the refractive index of silica, for example, may be used as a material for the clad 52, and UV curable resin, for example, may be used as a material for the plastic clad 53.

A first FBG (Fiber Bragg Grating) 55 is provided at one end of the amplifying optical fiber 50 opposite to the end with which the optical combiner 100 is connected, and a second FBG 56 is provided at the other end of the amplifying optical fiber with which the optical combiner 100 is connected. The first FBG 55 is configured to reflect 99% or more light in part of a wavelength band of spontaneous emission light emitted when the rare-earth elements doped in the core 51 of the amplifying optical fiber 50 are pumped. On the other hand, the second FBG 56 is configured to reflect light in the wavelength band at the reflectance equal to or less than 50%.

Further, a single mode fiber 41 is connected with the one end of the amplifying optical fiber 50 and a reflection-free termination 42 is connected to an end of the single mode fiber 41 opposite to the end with which the amplifying optical fiber 50 is connected.

Next, amplification and outputting of laser light with the fiber laser device 200 will be described.

First, pumping light is output from a plurality of LDs 25 of the pumping light source 26. The pumping light to be output has a wavelength of 915 nm, for example. The pumping light output from the pumping light source 26 propagates as multi mode light through each multi mode fiber 20 connected with each LD 25, and is input to the clad 32 of the double clad fiber 30 at the fused portion 110. The pumping light input to the clad 32 of the double clad fiber 30 propagates as multi mode light through the core 31 and clad 32 of the double clad fiber 30, and is input to the other end of the amplifying optical fiber 50 into the amplifying optical fiber 50 through the second FBG 56. The pumping light input to the amplifying optical fiber 50 propagates through the core 51 and clad 52 of the amplifying optical fiber 50, and part of the pumping light is absorbed by the rare-earth elements doped in the core 51 of the amplifying optical fiber 50. As a result, the rare-earth elements are pumped. Then, the pumped rare-earth elements emit spontaneous emission light of a specific wavelength. The spontaneous emission light in this case may be light having a center wavelength of 1070 nm when the wavelength of the pumping light is 915 nm as described above, for example.

A resonator constituted by the first FBG 55 and the second FBG 56 produces laser oscillation based on the spontaneous emission light. Then, part of laser light is transmitted through the second FBG 56.

The laser light transmitted through the second FBG 56 is output from the other end of the amplifying optical fiber 50. Then, the laser output from the amplifying optical fiber 50 is input to the double clad fiber 30 of the optical combiner 100, and propagates as single mode light through the core 31 of the double clad fiber 30. Then, the laser light propagating through the double clad fiber 30 is input to the single mode fiber 10 at the fused portion 110, and propagates as single mode light. Laser light is then output from the other end of the single mode fiber 10 which is a free end.

Note that light transmitted through the first FBG 55 propagates through the single mode fiber 41, and is converted into heat at the reflection-free termination 42.

With the fiber laser device 200 according to the present embodiment, pumping light is input to the other end of the amplifying optical fiber 50 through the optical combiner 100, and the rare-earth elements of the amplifying optical fiber 50 are pumped to emit spontaneous emission light. This spontaneous emission light travels back and forth between the first FBG 55 and second FBG 56, and is amplified as laser light. Then, part of laser light is transmitted through the second FBG 56, and is output from the other end of the amplifying optical fiber 50. The laser light output from the amplifying optical fiber 50 propagates through the core 31 of the double clad fiber 30 of the optical combiner 100, is input to the single mode fiber 10 and is output from the single mode fiber 10. In this case, even when laser light is scattered at the fused portion 110 at which the double clad fiber 30 and single mode fiber 10 are fused and laser light leaks from the core 11 of the single mode fiber 10, the leaked laser light is prevented from being input to the multi mode fibers 20 since the multi mode fibers 20 and single mode fiber 10 are not fused. Consequently, the leaked laser light is prevented from being input to the LDs 25 of the pumping light source 26 through the multi mode fibers 20, so that it is possible to prevent the pumping light source 26 from being damaged.

Further, in the present embodiment, the single mode fiber 10 and the multi mode fibers 20 are spaced apart, so that it is possible to prevent the leaked laser light from being input to the multi mode fibers 20.

Furthermore, in the present embodiment, a plurality of multi mode fibers 20 are fused to the double clad fiber 30, so that it is possible to input much multi mode light to the double clad fiber 30.

Second Embodiment

Figure 6:
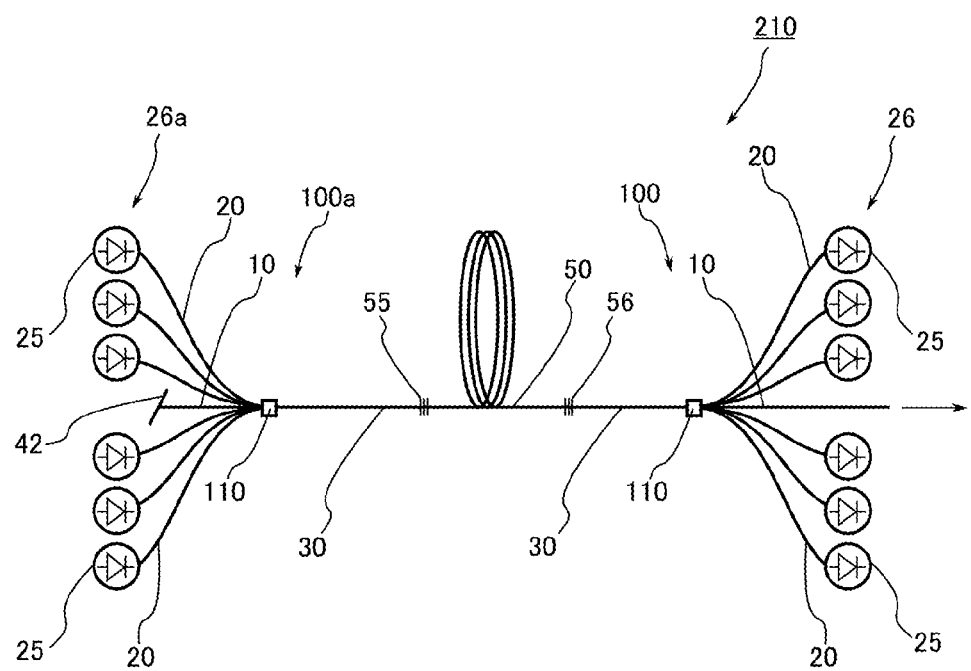
FIG. 6 shows a fiber laser device according to a second embodiment of the invention.

Next, a second embodiment of the invention will be described in detail referring to FIG. 6. Note that components that are identical or similar to those in the first embodiment are indicated by the same reference numerals and redundant description will not be repeated. FIG. 6 shows a fiber laser device according to the second embodiment of the invention.

As shown in FIG. 6, a fiber laser device 210 according to the second embodiment differs from the first embodiment in that the one end of the amplifying optical fiber 50 at which the first FBG 55 is formed is connected with a second optical combiner 100a, and that the second optical combiner 100a is connected with a second pumping light source 26a.

Further, the second optical combiner 100a differs from the optical combiner 100 in that the end of the single mode fiber 10 opposite to the end with which the double clad fiber 30 is connected is not a free end and is connected with the reflection-free termination 42, and the other configuration of the second optical combiner 100a is the same as that of the optical combiner 100. Furthermore, the end of the double clad fiber 30 in the second optical combiner 100a opposite to the end with which the single mode fiber 10 and the multi mode fibers 20 are connected is connected with the one end of the amplifying optical fiber 50.

Still further, the second pumping light source 26a has the same configuration as the pumping light source 26, and each LD 25 constituting the second light pumping source 26a is connected with each multi mode fiber 20 of the second optical combiner 100a.

The fiber laser device 210 according to the present embodiment can input pumping light to the end opposite to the one end of the amplifying optical fiber 50, so that it is possible to output more intense laser light. On the other hand, when laser light travels back and forth between the first FBG 55 and second FBG 56, there are cases where part of laser light is transmitted through the first FBG 55. The laser light transmitted through the first FBG 55 propagates through the core 31 of the double clad fiber 30 of the second optical combiner 100a, and is input to the single mode fiber 10. In this case, even when laser light is scattered at the fused portion 110 at which the double clad fiber 30 and the single mode fiber 10 are fused and the laser light leaks from the core 11 of the single mode fiber 10, the leaked laser light is prevented from being input to the multi mode fibers 20 in the optical combiner 100a. Consequently, it is possible to prevent the second pumping light source 26a connected with the multi mode fibers 20 of the second optical combiner 100a from being damaged.

Third Embodiment

Figure 7:
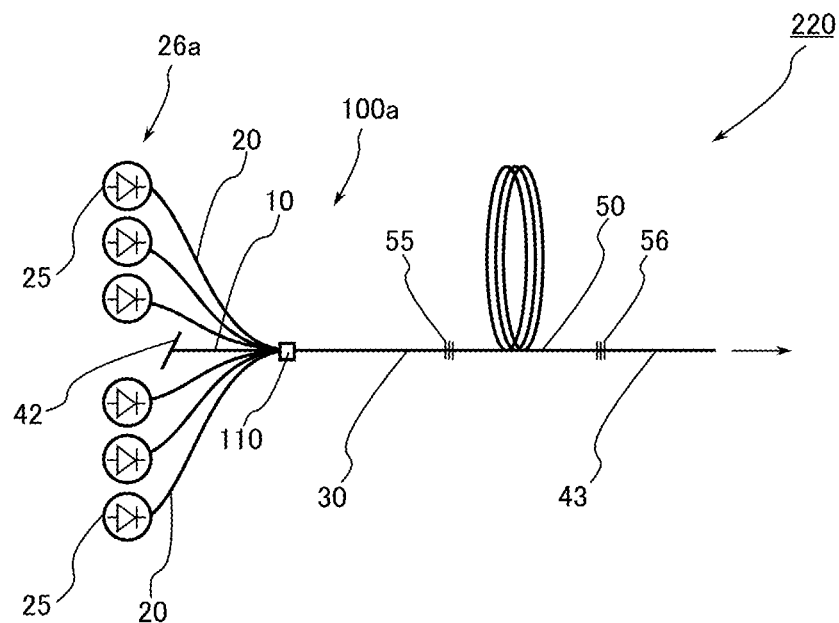
FIG. 7 shows a fiber laser device according to a third embodiment of the invention.

Next, a third embodiment of the invention will be described in detail referring to FIG. 7. Note that components that are identical or similar to those in the second embodiment are indicated by the same reference numerals and redundant description will not be repeated. FIG. 7 shows a fiber laser device according to the third embodiment of the invention.

As shown in FIG. 7, a fiber laser device 220 according to the present embodiment differs from the second embodiment in that the fiber laser device 220 does not include the optical combiner 100, and a single mode fiber 43 is provided at the end opposite to the end at which the second FBG 56 of the amplifying optical fiber 50 is provided. Hence, the laser light which is amplified by the amplifying optical fiber 50 and which is output through the second FBG 56 is output from the end of the single mode fiber 43 opposite to the end with which the amplifying optical fiber 50 is connected.

The fiber laser device 220 according to the present embodiment can reduce core propagation loss at the emission end and, consequently, increase the energy conversion efficiency from pumping light into laser light.

Fourth Embodiment

Figure 8:
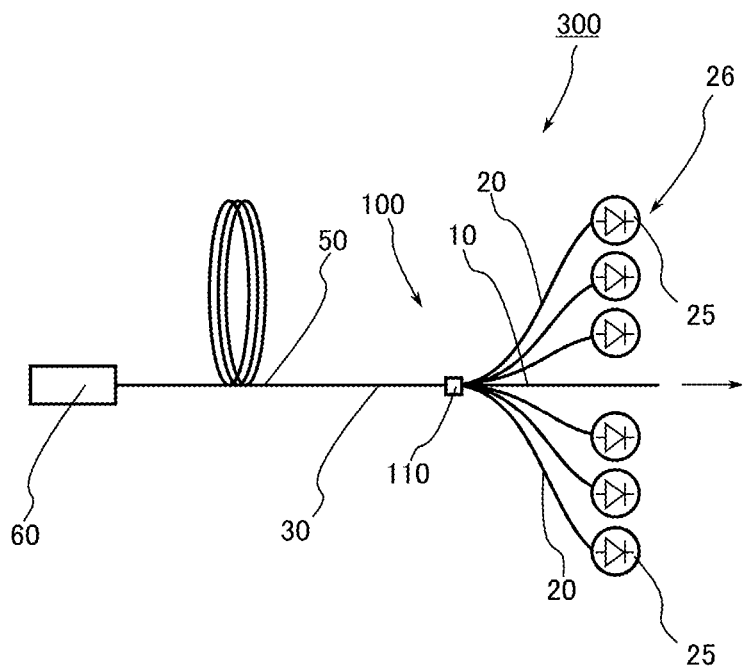
FIG. 8 shows a fiber laser device according to a fourth embodiment of the invention.

Next, a fourth embodiment of the invention will be described in detail referring to FIG. 8. Note that components that are identical or similar to those in the first embodiment are indicated by the same reference numerals and redundant description will not be repeated. FIG. 8 shows a fiber laser device according to the fourth embodiment of the invention.

As shown in FIG. 8, a fiber laser device 300 according to the present embodiment differs from the first embodiment in that the one end of the amplifying optical fiber 50 is connected with a seed laser light source 60, and the amplifying optical fiber 50 does not have the first FBG 55 and the second FBG 56.

The seed laser light source 60 outputs seed laser light to be amplified by stimulated emission from the rare-earth elements doped in the core 51 of the amplifying optical fiber 50. When pumping light of 915 nm, for example, is output from the pumping light source 26 as described above, seed laser light having the wavelength of 1070 nm, for example, is output from the seed laser light source 60.

In this fiber laser device 300, the pumping light output from a plurality of LDs 25 of the pumping light source 26 is absorbed by the rare-earth elements doped in the core 51 of the amplifying optical fiber 50. As a result, the rare-earth elements are pumped. Then, when the seed laser light output from the seed laser light source 60 is input to the amplifying optical fiber 50, the seed laser light is amplified by stimulated emission from the pumped rare-earth elements, and is output from the other end of the amplifying optical fiber 50. Similarly to the first embodiment, the laser light to be output is output from the free end of the single mode fiber 10 in the optical combiner 100.

The fiber laser device 300 according to the present embodiment can reduce core propagation loss in a light amplifying circuit and, consequently, increase the energy conversion efficiency from pumping light into laser light.

Fifth Embodiment

Figure 9:
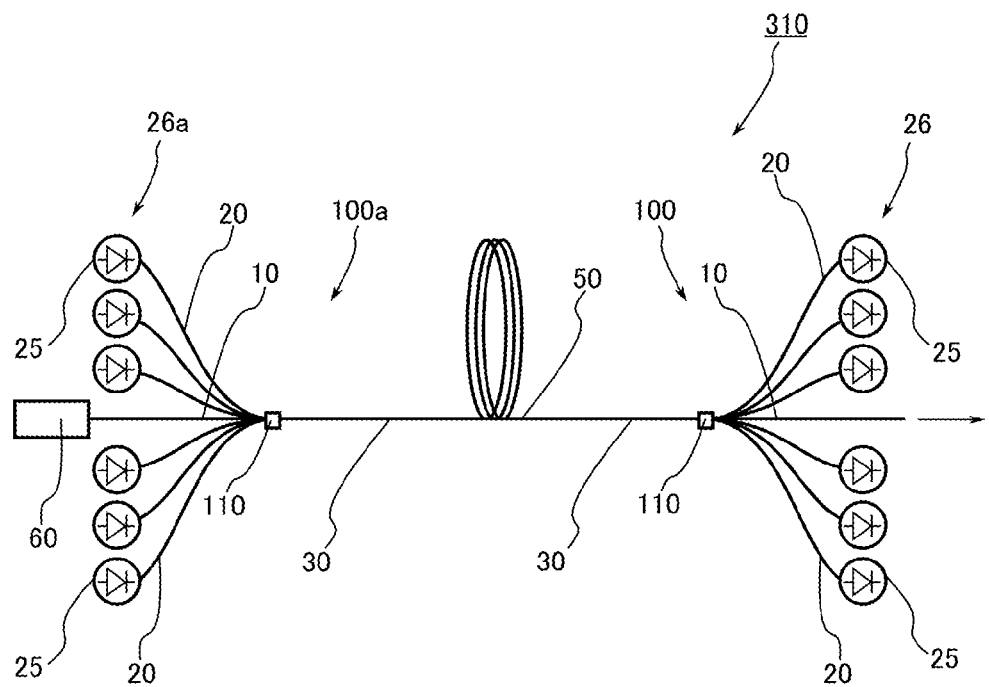
FIG. 9 shows a fiber laser device according to a fifth embodiment of the invention.

Next, a fifth embodiment of the invention will be described in detail referring to FIG. 9. Note that components that are identical or similar to those in the fourth embodiment are indicated by the same reference numerals and redundant description will not be repeated. FIG. 9 shows a fiber laser device according to the fifth embodiment of the invention.

As shown in FIG. 9, a fiber laser device according to the present embodiment differs from the first embodiment in that the one end of the amplifying optical fiber 50 is connected with a second optical combiner 100*a*, and the second optical combiner 100*a* is connected with a second pumping light source 26*a*.

The second optical combiner 100*a* differs from the optical combiner 100 in that the end of the single mode fiber 10 opposite to the end with which the double clad fiber 30 is connected is not a free end but is connected with a seed laser light source 60, and the other configuration is the same as the optical combiner 100. Further, the end of the double clad fiber 30 in the second optical combiner 100*a* opposite to the end with which the single mode fiber 10 and the multi mode fibers 20 are connected is connected with the one end of the amplifying optical fiber 50.

Further, the second pumping light source 26*a* has the same configuration as the pumping light source 26, and each of the LDs 25 constituting the second light pumping source 26*a* is connected with each multi mode fiber 20 of the second optical combiner 100*a*.

With the fiber laser device 310 according to the present embodiment, seed laser light is input to the amplifying optical fiber 50 through the single mode fiber of the second optical combiner 100*a*. In addition, pumping light is input to the one end and the other end of the amplifying optical fiber 50, so that it is possible to output more intense laser light. At this time, there are cases where part of laser light is reflected at the output end. In this case, the reflected laser light propagates from the amplifying optical fiber 50 to the second optical combiner 100*a*. In this case, the reflected laser light is prevented from being input to the multi mode fibers 20 at a portion of the second optical combiner 100*a* at which the double clad 30 and single mode fiber 10 are fused. Further, when the seed laser light propagates from the single mode fiber 10 to the double clad fiber 30 in the second optical combiner 100*a*, even if the seed laser light is reflected and leaks from the core 11 of the single mode fiber 10, the leaked seed laser light is prevented from being input to the multi mode fibers 20 in the second optical combiner 100*a*. Consequently, it is possible to prevent the second pumping light source 26*a* connected with the multi mode fibers 20 of the second optical combiner 100*a* from being damaged.

Sixth Embodiment

Figure 10:
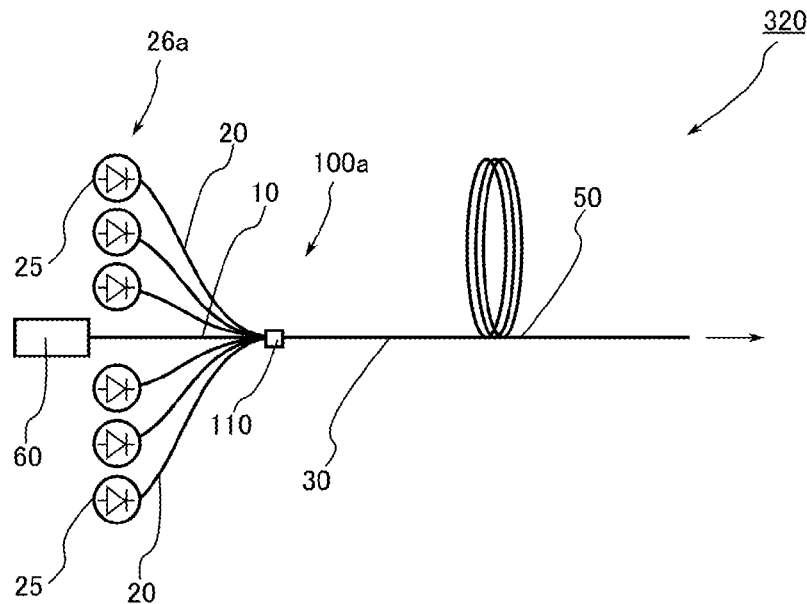
FIG. 10 shows a fiber laser device according to a sixth embodiment of the invention.

Next, a sixth embodiment of the invention will be described in detail referring to FIG. 10. Note that components that are identical or similar to those in the fifth embodiment are indicated by the same reference numerals and redundant description will not be repeated. FIG. 10 shows a fiber laser device according to the sixth embodiment of the invention.

As shown in FIG. 10, a fiber laser device 320 according to the present embodiment differs from the fifth embodiment in that the fiber laser device 320 does not have the optical combiner 100. Consequently, laser light resulting from seed laser light amplified and output by the amplifying optical fiber 50 is output from the other end of the amplifying optical fiber 50.

The fiber laser device 320 according to the present embodiment can reduce core propagation loss at the emission end and, consequently, increase the energy conversion efficiency from pumping light into laser light.

Although the invention has been described above by referring to the first to sixth embodiments as examples, the invention is by no means limited thereto.

Although the double clad fiber 30 is used as a large area fiber, the single mode fiber 10 is used as a fiber for propagation of laser light and the multi mode fibers 20 are used as fibers for propagation of pumping light in the first to sixth embodiments, the invention is by no means limited thereto. For example, an optical fiber coated with a clad having three or more cores may be used for the large area fiber. Further, an optical fiber which propagates light of several modes may be used for the fiber for propagation of laser light, and a double clad fiber having a smaller diameter than the large area fiber may be used. Furthermore, a double clad fiber may be used for the fiber for propagation of pumping light.

Still further, although the core 31 of the double clad fiber 30 of the optical combiner 100 (100a) is not doped with the rare-earth elements in the first, second and fourth to sixth embodiments, the invention is by no means limited thereto. For example, the core 31 of the double clad fiber 30 may be doped with the rare-earth elements, so that the amplifying optical fiber 50 and the double clad fiber 30 have the same configuration. In this case, laser light is also amplified in the double clad fiber 30, so that it is possible to output more intense laser light. Further, in this case, the double clad fiber 30 in the optical combiner 100 (100a) is preferably formed of a portion which is an extension of the amplifying optical fiber 50. In this case, there is no connection portion between the double clad fiber 30 and amplifying optical fiber 50, so that it is possible to prevent laser light from being lost due to scattering of laser light at the connection portion. Moreover, by configuring the double clad fiber 30 and amplifying optical fiber 50 in the same manner, the fiber laser device can be produced at a low cost.

Furthermore, although the fiber laser devices 300 to 320 have the seed laser light source 60 in the fourth to sixth embodiments, the invention is by no means limited thereto, and the seed laser light source 60 may be provided outside the fiber laser device and seed laser light may be input from outside of the fiber laser device.

INDUSTRIAL APPLICABILITY

The invention provides an optical combiner which can realize a fiber laser device which prevents a pumping light source from being damaged, and a fiber laser device having the optical combiner.

DESCRIPTION OF REFERENCE NUMERALS

10 . . . single mode fiber
11 . . . core
12 . . . clad
20 . . . multi mode fiber
21 . . . core
22 . . . clad
26, 26a . . . pumping light source
30 . . . double clad fiber
31 . . . core
32 . . . clad
33 . . . plastic clad
35 . . . end surface
50 . . . amplifying optical fiber
51 . . . core
52 . . . clad
53 . . . plastic clad
60 . . . seed laser light source
100, 100a . . . optical combiner
200, 210, 220, 300, 310, 320 . . . fiber laser device

The invention claimed is:

1. An optical combiner comprising:
at least one fiber for propagation of pumping light having a core and a clad and configured to propagate pumping light from a pumping light source;
a fiber for propagation of laser light having a core and a clad and configured to propagate laser light having a longer wavelength than the pumping light; and
a large area fiber having a core and a clad and configured to propagate the laser light and the pumping light, wherein
one end surface of the fiber for propagation of laser light and one end surface of the large area fiber are fused such that the core of the fiber for propagation of laser light and the core of the large area fiber overlap in a longitudinal direction of the large area fiber,
one end surface of the fiber for propagation of pumping light and the one end surface of the large area fiber are fused such that the core of the fiber for propagation of pumping light and the clad of the large area fiber overlap in the longitudinal direction of the large area fiber, and
the fiber for propagation of laser light and the fiber for propagation of pumping light are not fused to each other,
wherein the fiber for propagation of laser light and the fiber for propagation of pumping light are separated from each other by an open space therebetween at the one end surface of the large area fiber.

2. The optical combiner according to claim 1, wherein an outer diameter of the clad of the fiber for propagation of laser light is equal to or smaller than a diameter of the core of the fiber for propagation of pumping light.

3. A fiber laser device comprising:
a pumping light source configured to output pumping light;
an optical combiner according to claim 1; and
an amplifying optical fiber having a core doped with a rare-earth element to be pumped by the pumping light, and a clad, wherein
a first FBG configured to reflect light in part of a wavelength band of spontaneous emission light emitted by the rare-earth element is formed at one end of the amplifying optical fiber, and a second FBG configured to reflect light of a wavelength equal to that of light reflected by the first FBG at a reflectance lower than that of the first FBG is formed at the other end of the amplifying optical fiber, and
in the optical combiner, the fiber for propagation of pumping light is connected with the pumping light source, and the large area fiber is connected with the other end of the amplifying optical fiber.

4. A fiber laser device comprising:
a pumping light source configured to output pumping light;
an optical combiner according to claim 1; and
an amplifying optical fiber having a core doped with a rare-earth element to be pumped by the pumping light, and a clad, wherein
a first FBG configured to reflect light in part of a wavelength band of spontaneous emission light emitted by the rare-earth element is formed at one end of the amplifying optical fiber, and a second FBG configured to reflect light of a wavelength equal to that of light reflected by the first FBG at a reflectance lower than that of the first FBG is formed at the other end of the amplifying optical fiber, and
in the optical combiner, the fiber for propagation of pumping light is connected with the pumping light source, and the large area fiber is connected with the other end of the amplifying optical fiber,
wherein the fiber laser device further comprises:
a second pumping light source configured to output pumping light; and
a second optical combiner according to claim 1 as a second optical combiner, wherein
in the second optical combiner, the fiber for propagation of pumping light is connected with the second pumping light source, and the large area fiber is connected with the one end of the amplifying optical fiber.

5. A fiber laser device comprising:
a pumping light source configured to output pumping light;
an optical combiner according to claim 1; and
an amplifying optical fiber having a core doped with a rare-earth element to be pumped by the pumping light and a clad, and configured to receive an input of seed laser light of a longer wavelength than the pumping light to be amplified by stimulated emission from the rare-earth element to one end thereof, wherein in the optical combiner, the fiber for propagation of pumping light is connected with the pumping light source, and the large area fiber is connected with the other end of the amplifying optical fiber.

6. A fiber laser device comprising:

a pumping light source configured to output pumping light;

an optical combiner according to claim 1; and an amplifying optical fiber having a core doped with a rare-earth element to be pumped by the pumping light and a clad, and configured to receive an input of seed laser light of a longer wavelength than the pumping light to be amplified by stimulated emission from the rare-earth element to one end thereof, wherein in the optical combiner, the fiber for propagation of pumping light is connected with the pumping light source, and the large area fiber is connected with the other end of the amplifying optical fiber, wherein the fiber laser device further comprises:

a second pumping light source configured to output pumping light; and a second optical combiner according to claim 1 as a second optical combiner, wherein:

in the second optical combiner, the fiber for propagation of pumping light is connected with the second pumping light source, and the large area fiber is connected with the one end of the amplifying optical fiber, and the seed laser light is input to the amplifying optical fiber through the second optical combiner.

7. A fiber laser device comprising:

a pumping light source configured to output pumping light;

an optical combiner according to claim 1; and an amplifying optical fiber having a core doped with a rare-earth element to be pumped by the pumping light, and a clad, wherein a first FBG configured to reflect light in part of a wavelength band of spontaneous emission light emitted by the rare-earth element is formed at one end of the amplifying optical fiber, and a second FBG configured to reflect light of a wavelength equal to that of light reflected by the first FBG at a reflectance lower than that of the first FBG is formed at the other end of the amplifying optical fiber, and in the optical combiner, the fiber for propagation of pumping light is connected with the pumping light source, and the large area fiber is connected with the one end of the amplifying optical fiber.

8. A fiber laser device comprising:

a pumping light source configured to output pumping light;

an optical combiner according to claim 1; and an amplifying optical fiber having a core doped with a rare-earth element to be pumped by the pumping light and a clad, and configured to receive an input of seed laser light to be amplified by stimulated emission from the rare-earth element to one end thereof, wherein in the optical combiner, the fiber for propagation of pumping light is connected with the pumping light source, and the large area fiber is connected with the one end of the amplifying optical fiber, and the seed laser light is input to the amplifying optical fiber through the optical combiner.

9. The fiber laser device according to any one of claims 3 to 6 and 8, wherein the core of the large area fiber in the optical combiner is doped with a rare-earth element to be pumped by the pumping light, the amplifying optical fiber and the large area fiber are configured in a same manner, and the large area fiber in the optical combiner is formed of a portion which is an extension of the amplifying optical fiber.

* * * * *